United States Patent [19]
Ishida

[11] Patent Number: 5,486,711
[45] Date of Patent: Jan. 23, 1996

[54] SOLID-STATE IMAGE SENSOR WITH OVERLAPPING SPLIT GATE ELECTRODES

[75] Inventor: Tomohisa Ishida, Kawasaki, Japan

[73] Assignee: Nikon Corporation, Tokyo, Japan

[21] Appl. No.: 265,723

[22] Filed: Jun. 24, 1994

[30] Foreign Application Priority Data

Jun. 25, 1993 [JP] Japan .................... 5-154716

[51] Int. Cl.⁶ .................... H01L 27/14; H01L 31/00
[52] U.S. Cl. .................... 257/258; 257/291; 257/292; 257/448; 257/459
[58] Field of Search .................... 257/448, 443, 257/446, 291, 292, 258, 459

[56] References Cited

U.S. PATENT DOCUMENTS

| | | | |
|---|---|---|---|
| 4,524,391 | 6/1985 | Nishizawa et al. | 257/258 X |
| 4,878,120 | 10/1989 | Matsumoto et al. | 257/291 X |
| 5,341,008 | 8/1994 | Hynecek | 257/291 X |

FOREIGN PATENT DOCUMENTS

| | | | |
|---|---|---|---|
| 2427256 | 1/1975 | Germany | 257/291 |
| 60-206063 | 10/1985 | Japan . | |
| 1207964 | 8/1989 | Japan | 257/291 |
| 5235317 | 9/1993 | Japan | 257/258 |

*Primary Examiner*—William Mintel
*Attorney, Agent, or Firm*—Keck, Mahin & Cate

[57] ABSTRACT

An amplification-type solid-state image sensor includes a plurality of picture elements each thereof including a phototransistor. The phototransistor includes a plurality of split gate electrodes to which is applied a voltage for inducing carriers of the same conductivity type as a source region and a drain region in a surface of a semiconductor layer forming a channel. During a resetting period a control voltage is applied simultaneously to all of the split gate electrodes and during a photogenerated charge storage period a control voltage is applied alternately to the split gate electrodes. The occurrence of a dark current due to a boundary surface level present at a boundary surface between an insulator layer and the semiconductor layer is restrained. During a signal reading period a carrier inducing voltage is applied to one of the split gate electrodes which is not adjacent to the source region so that the region just below the gate electrode becomes an effective drain region and a photogenerated charge is transferred to and collected at the other gate electrode adjoining the source region, thereby improving the sensitivity of the image sensor.

4 Claims, 12 Drawing Sheets

SOLID-STATE IMAGE SENSOR WITH OVERLAPPING SPLIT GATE ELECTRODES

BACKGROUND OF THE INVENTION

1. Field of the Invention

The present invention relates to an amplification-type solid-state image sensor mainly comprised of phototransistors.

2. Related Background Art

A solid-state image sensor comprised of MIS (Metal Insulator Semiconductor)-type static induction transistors has been disclosed, for example, in Japanese Laid-Open Patent Application No. 60-206063. FIG. 21 of the accompanying drawings shows the general construction of the MIS-type static induction transistors forming the solid-state image sensor.

FIG. 21 shows that an $N^-$-type semiconductor layer 212 of the reverse conductivity type is formed on a $P^-$-type semiconductor substrate 211, that an $N^+$ source region 213 and an $N^+$ drain region 215 are formed in a spaced relation in the surface layer of the $N^-$-type semiconductor layer 212, that a source electrode 214 is formed in the source region 213 and that a gate electrode 216 is formed on an insulator layer 217 in the region separating the source region and the drain region. It is to be noted that although not shown in the Figure, the drain region 215 is provided with a drain electrode which is not shown.

With this solid-state image sensor, in order that a charge generated by light is to be stored, a voltage is applied to the gate electrode 216 so that it is reverse biased with respect to the source electrode 214 and the drain electrode and thus no current flows between the source region 213 and the drain region 215. Under such reverse-biased condition, the depletion of charge carriers occurs in the semiconductor layer 212 below the gate electrode 216 forming a channel region so that the positive holes generated within the depletion layer are stored in the surface portion of the semiconductor layer 212 below the gate electrode 216.

When a signal is to be read out, a voltage which is intermediary between those of the charge storage period and the change resetting period is applied to the gate electrode 216 so that a current amplified in accordance with the amount of the holes generated by the light reception flows between the source region 213 and the drain region 215. Also, at this time the holes stored below the gate electrode 216 are maintained therein.

In order that the charge generated by the light is to be reset, a voltage is applied to the gate electrode 216 so that it is forward biased with respect to the source electrode 214 or the drain electrode. When this occurs, the holes stored in the semiconductor layer 212 below the gate electrode 216 are discharged in a short period of time toward the $P^-$ substrate 211 side.

As described hereinabove, owing to such unit structure of the MIS-type static induction transistors as shown in FIG. 21, not only the required operations for the solid-state image sensor, i.e., the photoelectric conversion, the storage of charges, the reading of signals and the resetting of stored charges can be performed but also the resetting operation can be effected at high speeds without the occurrence of resetting noise and moreover the reading of amplified signals can be effected in a nondestructive manner.

However the conventional solid-state image sensor of the above-described construction is disadvantageous in that when storing a charge generated by light, the depletion of charge carriers occurs in the semiconductor layer below the gate electrode in each MIS structure with the result that the dark current generated at the boundary surface between the insulator layer and the semiconductor layer becomes so large that it cannot be ignored and therefore the S/N ratio is deteriorated in cases where the intensity of received light is weak.

SUMMARY OF THE INVENTION

It is the primary object of the present invention to provide a solid-state image sensor which overcomes the foregoing deficiencies in the prior art and is capable of reducing the dark current at the previously mentioned boundary surface of each MIS structure.

In a solid-state image sensor according to a first aspect of the present invention, each unit picture element includes a semiconductor substrate of a first conductivity type, a semiconductor layer of a second conductivity type formed on the semiconductor substrate, a source region and drain region of the second conductivity type which are formed in the surface of the semiconductor layer and each having a higher impurity density than that of the semiconductor layer and a gate electrode formed on the surface of the semiconductor layer between the source region and the drain region so as to be insulated from the semiconductor layer surface and surround the source region, and the gate electrode is composed of a plurality of split gate electrodes which partially overlap one another through the insulator layer.

In a solid-state image sensor according to a second aspect of the present invention, each unit picture element includes a semiconductor substrate of a first conductivity type, a semiconductor layer of a second conductivity type formed on the semiconductor substrate, a semiconductor layer of the first conductivity type formed on the semiconductor layer of the second conductivity type, a source region and drain region of the second conductivity type which are formed on the first conductivity-type semiconductor layer so as to be connected to the second conductivity-type semiconductor layer, each of the source region and the drain region having a higher density than that of the second conductivity type semiconductor layer impurity, and a gate electrode formed on the surface of the first conductivity-type semiconductor layer between the source region and the drain region so as to be insulated from the said surface and the surround the source region, and the gate electrode is composed of a plurality of split gate electrodes which partly overlap one another through the insulator layer.

A preferred modified form of the solid-state image sensor according to the first aspect or the second aspect is constructed so that a voltage tending to induce carriers of the same conductivity type as the second conductivity-type semiconductor layer in the surface thereof is applied to the plurality of split gate electrodes.

With the solid-state image sensor according to the first aspect, when applying the voltage tending to induce carriers of the same conductivity type as the source region and the drain region in the surface of the second conductivity-type semiconductor layer, during the period of resetting the voltage is applied to all of the plurality of split gate electrodes, whereas during the storage period of a photogenerated charge the voltage is applied successively to at least other than one of the plurality of split gate electrodes. By so doing, there is the effect of reducing the generation of dark current due to the boundary surface level present at the boundary surface between the insulator layer and the semiconductor layer.

Also, during the period of signal reading the carrier inducing voltage is applied to the gate electrode which is not adjacent to the source region so that the portion just beneath the gate electrode becomes an effective drain region and the photogenerated charge is transferred to and collected at the gate electrode adjoining the source region, thereby improving the sensitivity of the sensor.

The solid-state image sensor according to the second aspect has, in addition to the advantage according to the first aspect, an additional advantage of preventing a phenomenon in which a part of the photogenerated charge is vanished due to the recombination with the electrons in the conduction band caused in the semiconductor layer by the electron filling operation. In other words, with the solid-state imaging sensor according to the second aspect, during its storage period the photogenerated charge is stored in the bulk of the semiconductor layer of the same conductivity type. As a result, there is no danger of the photogenerated charge being captured in the electron-filled insulator layer-semiconductor layer boundary surface level and there is no vanishing of the charge due to the recombination of the photogenerated charge and the electrons through the boundary surface level, thereby further enhancing the sensor's photosensitivity or the sensitivity to light.

The above and other objects, features and advantages of the present invention will becomed more apparent from the following description of its preferred embodiments shown for illustrative purposes only without any intention of limitation when taken in conjunction with the accompanying drawings.

DETAILED DESCRIPTION OF THE PREFERRED EMBODIMENTS

First Embodiment

Figure 1:
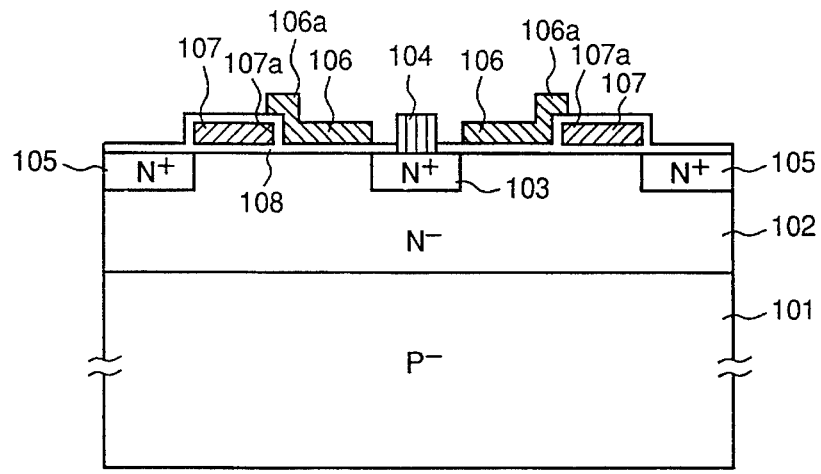
FIG. 1 is a sectional view taken along the line A–A' of FIG. 2, showing schematically the sectional construction of each unit picture element of a solid-state image sensor according to a first embodiment of the present invention.
Figure 2:
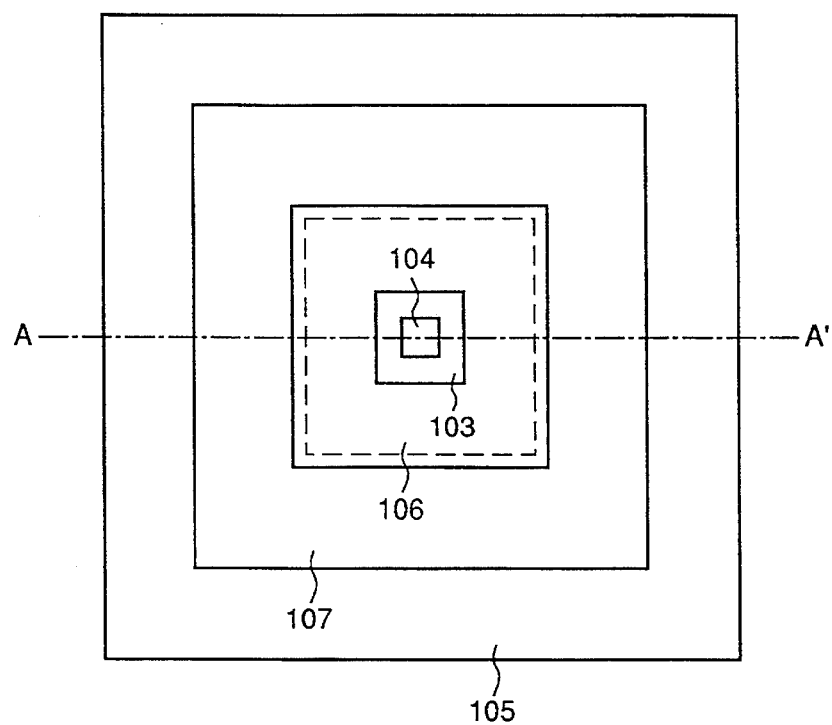
FIG. 2 is a schematic plan view of the unit picture element of the solid-state image sensor according to the first embodiment of the present invention.

FIG. 1 is a schematic sectional view of each picture element of a solid-state image sensor according to a first embodiment of the present invention and this section is shown as the sectional construction along the line A–A' of FIG. 2 showning a plan view of the picture element portion. In the solid-state image sensor of this embodiment, a plurality of unit picture elements of such construction as shown in the Figures are arranged in the form of a two-dimensional array.

In FIGS. 1 and 2, an $N^-$-type semiconductor layer 102 is formed and laid on a $P^-$-type substrate 101 and an $N^+$-type source region 103, a source electrode 104 and an $N^+$-type drain region 105 are formed in the surface portion of the semiconductor layer 102. Excluding the surface of the source electrode 104, the surface of the semiconductor layer 102 is covered with a thin insulator layer 108 and the source electrode 104 is exposed on the insulator layer 108. It is to be noted that in FIGS. 1 and 2 the illustration of a source line, a gate line and a drain electrode is omitted.

Two concentric split gate electrodes 106 and 107 are formed on the insulator layer 108 so as to cover the annular region between the source region 103 and the drain region 105. These gate electrodes 106 and 107 are made of a material which is transparent to a range of wavelengths utilized for imaging purposes, and the inner split gate electrode 106 adjacent to the outer side of the source region 103 is a main gate, whereas the outer split gate electrode 107 adjacent to the inner side of the drain region 105 is a sub gate electrode. The main gate electrode 106 and the sub gate electrode 107 are insulated from each other by the insulator layer 108 and an outer peripheral edge 106a of the main gate electrode 106 is placed upon an outer peripheral edge 107a of the sub gate electrode 107 through the insulator layer 108. While, in FIG. 1, the outer peripheral edge 106a of the main gate electrode 106 is positioned on the outer peripheral edge 107a of the sub gate electrode 107, this vertical positional relation may be reversed.

Then, the generation mechanism of a dark current at the boundary surface between the insulator layer and the semiconductor layer of the MIS-type static induction transistor and the method of preventing it will now be described.

Figure 4:
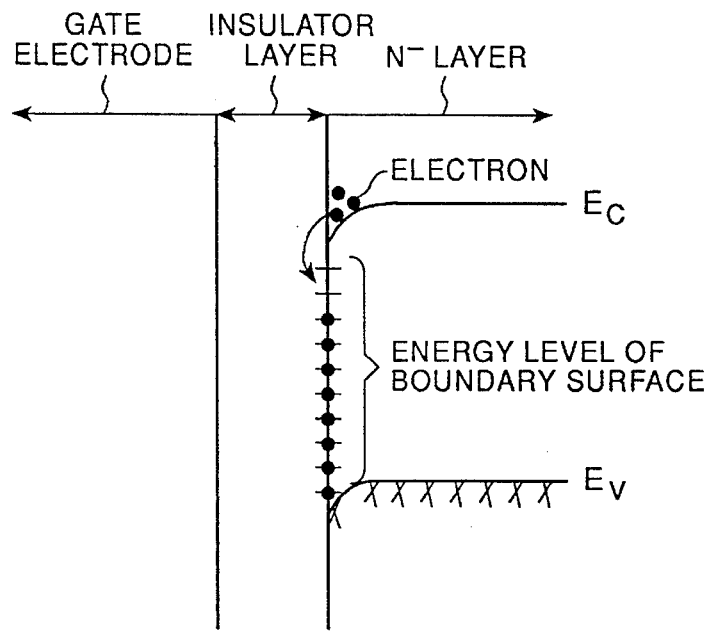
FIG. 4 is an accumulation-mode energy band diagram for explaining the generation mechanism of a dark current at the boundary surface between the insulator layer and the semiconductor layer.
Figure 21:
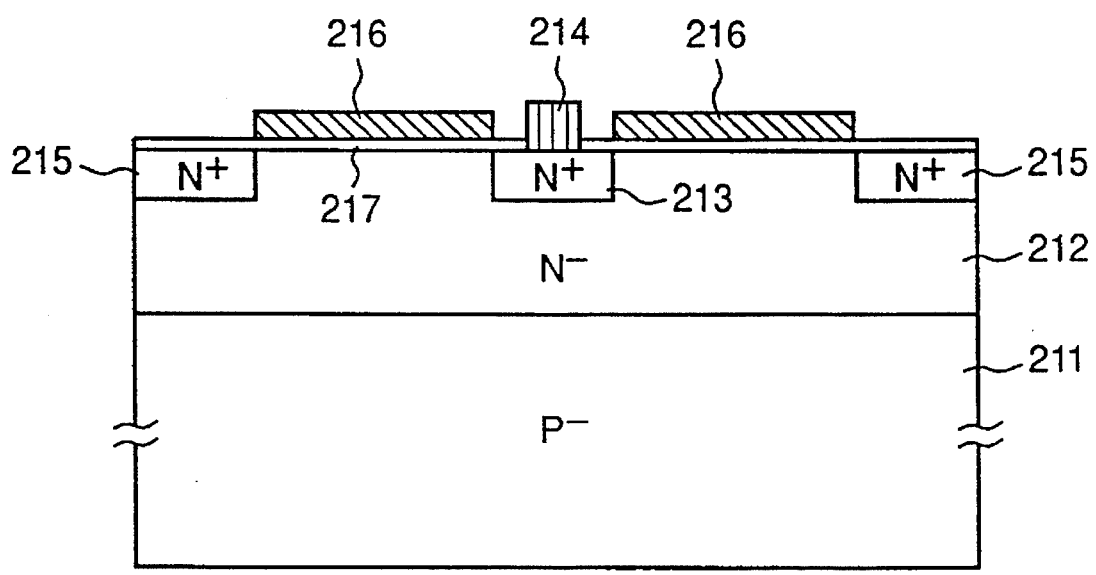
FIG. 21 shows schematically the sectional construction of each unit picture element of a conventional solid-state image sensor comprising MIS-type static induction transistors.

Assuming now the case of the non-split gate electrode in the conventional type shown in FIG. 21, in response to a resetting operation which applies a positive voltage to the gate electrode the stored charge (holes) in the surface of the $N^-$-type semiconductor layer is discharged to the $P^-$ semiconductor substrate. At the same time, a channel by electrons is formed in the surface of the $N^-$-type semiconductor layer so that an accumulation mode is established and the energy level of the boundary surface is filled with the electrons. This situation is illustrated as a diagram for the energy band below the gate electrode. In FIG. 4, symbol $E_c$ represents the energy level at the conduction band end and $E_v$ represents the energy level at the valence band end.

Figure 5:
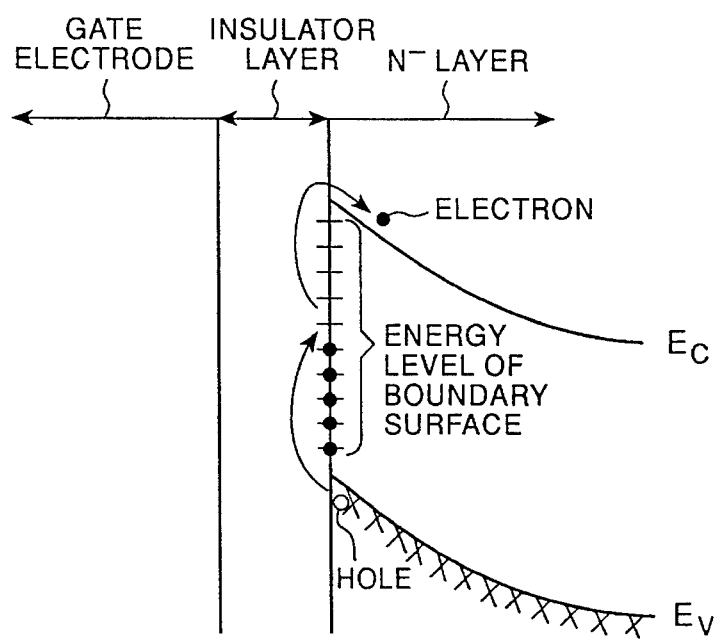
FIG. 5 is a deep depletion-mode energy band diagram for explaining the generation mechanism of a dark current at the boundary surface between the insulator layer and the semiconductor layer.

Then, when a negative voltage is applied to the gate electrode so that the transistor comes into a photogenerated charge storing condition, the depletion of charge carriers occurs in the $N^-$-type semiconductor layer below the gate electrode and a deep depletion mode is established, thereby causing the electrons captured in the energy levels of the boundary surface to be thermally emitted to the conduction band starting at the boundary surface level close to the conduction band. When the emission of the electrons proceeds to the boundary surface level close to the energy band gap center, the excitation of the electrons from the valence band thereto is started. This process can also be considered as the process of emitting the holes from the empty boundary surface levels to the valence band. The electrons captured in the boundary surface level close to the energy band gap center are further emitted to the conduction band and electron-hole pairs are generated through the boundary surface level. The electrons are removed by the electric field and the holes remain in the $N^-$ type semiconductor layer surface below the gate electrode, thereby generating a dark current. This situation is shown in FIG. 5. The generation of such electron-hole pairs is continued until the formation of an inversion layer.

At this time, if the boundary surface level close to the energy band gap center is always filled with electrons, the excitation of the electrons from the valence band will be prevented and no electron-hole pairs will be generated. Therefore, in order to reduce the generation of a dark current at the boundary surface, it is only necessary that the transition from the deep depletion mode to the accummulation mode is effected periodically through the control of the gate voltage and that the electrons are induced from the $N^+$-type source region or drain region into the semiconductor layer surface so as to fill the vacant boundary surface level near the energy band gap center with the induced electrons.

Where such electron filling is effected on the MIS-type static induction transistor storing the photogenerated charge, in order to prevent the stored photogenerated holes from being reset, it is necessary that the gate electrode is divided into two parts as shown in FIG. 1 and the operation of collecting the photogenerated holes below one of the divided gate electrodes and performing the electron filling operation on the other of the divided gate electrodes is alternately repeatedly performed periodically. By forming the divided gate electrodes so as to be placed one upon another through the insulator layer, the electron filling operation is made possible for the whole region of the semiconductor layer beneath the divided gate electrodes.

As regards the repetition period of the electron filling operation, in the literature "IEEE Transaction, Electron Device, vol. ED-38, pp.285–290, February 1991" by B. E.Burke et al it is stated that the following estimation can be made.

More specifically, the following expression defines an occupancy function $f(E_T, t)$ of a boundary surface level of an energy level $E_T$ at a time t.

$$f(E_T, t) = n_T(E_T, t)/N_T(E_T)$$

Here, symbol $N_T$ represents a boundary surface level density per unit area and unit energy, and $n_T$ an electron-filled boundary surface level density per unit area and unit energy. Therefore, df/dt is given as follows.

$$df/dt = e_P(1-f) - c_p\, p\, f - e_N f + c_N\, n\, (1-f) \qquad (1)$$

In the right member of the above equation, the first term corresponds to the speed of emission process of holes to the valence band, the second term to the speed of capture process of holes from the valence band, the third term to the speed of emission process of electrons to the conduction band and the fourth term to the speed of capture process of electrons from the conduction band. Here $e_P = \sigma_P\, v_{TH}\, n_i\, \exp\{(E_i - E_T)/k\,T\}$;

$c_P = \sigma_P\, v_{TH}$;

$e_N = \sigma_N\, v_{TH}\, n_i\, \exp\{(E_T - E_i)/k\,T\}$;

$c_N = \sigma_N\, v_{TH}$;

p, n: hole density and electron density at the surface;

$\sigma_P, \sigma_N$: capture cross section of holes and electrons;

$v_{TH}$: thermal velocity;

$n_i$: intrinsic carrier density;

$E_i$: intrinsic energy level.

As mentioned previously, when changing from the accumulation mode to the deep depletion mode, the solution of equation (1) under the conditions of $f(E_T, 0)=1$, n(t)=0, p(t)=0 results in the following $$f(E_T, t) = (e_P + e_N \exp\{-(e_P + e_N)t\})/(e_P + e_N) \qquad (2)$$

Owing to the fact that a time constant $t_c$ for the electron capture process in the accummulation mode is given as $t_c = (c_N\, n)^{-1}$ and that $t_c \approx 0.1$ nsec if $\sigma_N \approx 1 * 10^{-15}$ cm$^2$, $v_{TH} \approx 1*10^7$ cm/sec and $n \approx 10^{18}$ cm$^{-3}$, it will be seen that to set the initial condition to $f(E_T, 0)=1$ is appropriate.

When considering only the hole emission process, the hole generation speed $dQ_H/dt$ is given by the following equation.

$$\frac{dQ_H}{dt} = \int_{E_v}^{E_c} e_P(1-f)\, N_T\, dE_T \approx \qquad (3)$$

$$\sigma v_{TH} n_i N_T k T \int_0^\infty \frac{1 - \exp(-\sigma v_{TH} n_i t(x^{-1} + x))}{1 + x^2} dx$$

Here, assuming that the boundary surface level density $N_T$ is uniformly distributed within the band gap, the following result:

$$\sigma = \sqrt{(\sigma_P \sigma_N)},$$

$$x = \sqrt{(\sigma_P/\sigma_N)} * \exp\{(E_T - E_i)/kT\}.$$

Also, the integration range is expanded from zero to the infinity. The integral of equation (3) can be approximated as follows $$\int_0^\infty \frac{1 - \exp(-\sigma v_{TH} n_i t(x^{-1} + x))}{1 + x^2} dx \approx \quad (4)$$

$$\frac{\pi}{2} \{1 - \exp(-2.7\sigma v_{TH} n_i t)\}$$

Therefore, the hole generation speed $dQ_H/dt$ can be given as follows.

$$\begin{aligned} dQ_H/dt &= (\pi k T/2) N_T \sigma v_{TH} n_i * \{1 - \exp(-2.7 \sigma v_{TH} n_i t)\} \quad (5) \\ &= S_0 n_i \{1 - \exp(-t/\tau)\} \end{aligned}$$

Here, it is set so that $S_o = (\pi k T/2) N_T \sigma v_{TH}$ and $\tau = (2.7\sigma v_{TH} n_i)^{-1}$. Designated by $S_o$ is the surface hole generation speed under the steady-state condition when the charge carriers are depleted in the surface and the dark current density is given as $J_{dark} = q S_o n_i$.

As a result, the hole density $Q_H$ at the time t due to the dark current generated at the boundary surface becomes as follows $$Q_H = (J_{dark}/q)(t - \tau\{1 - \exp(-t/\tau)\}) \quad (6)$$

Therefore, it becomes $Q_H \approx (J_{dark}/q)(t^2/2\tau)$ when $t \ll \tau$, whereas it becomes $Q_H \approx (J_{dark}/q)t$ when $t \gg \tau$.

Figure 6:
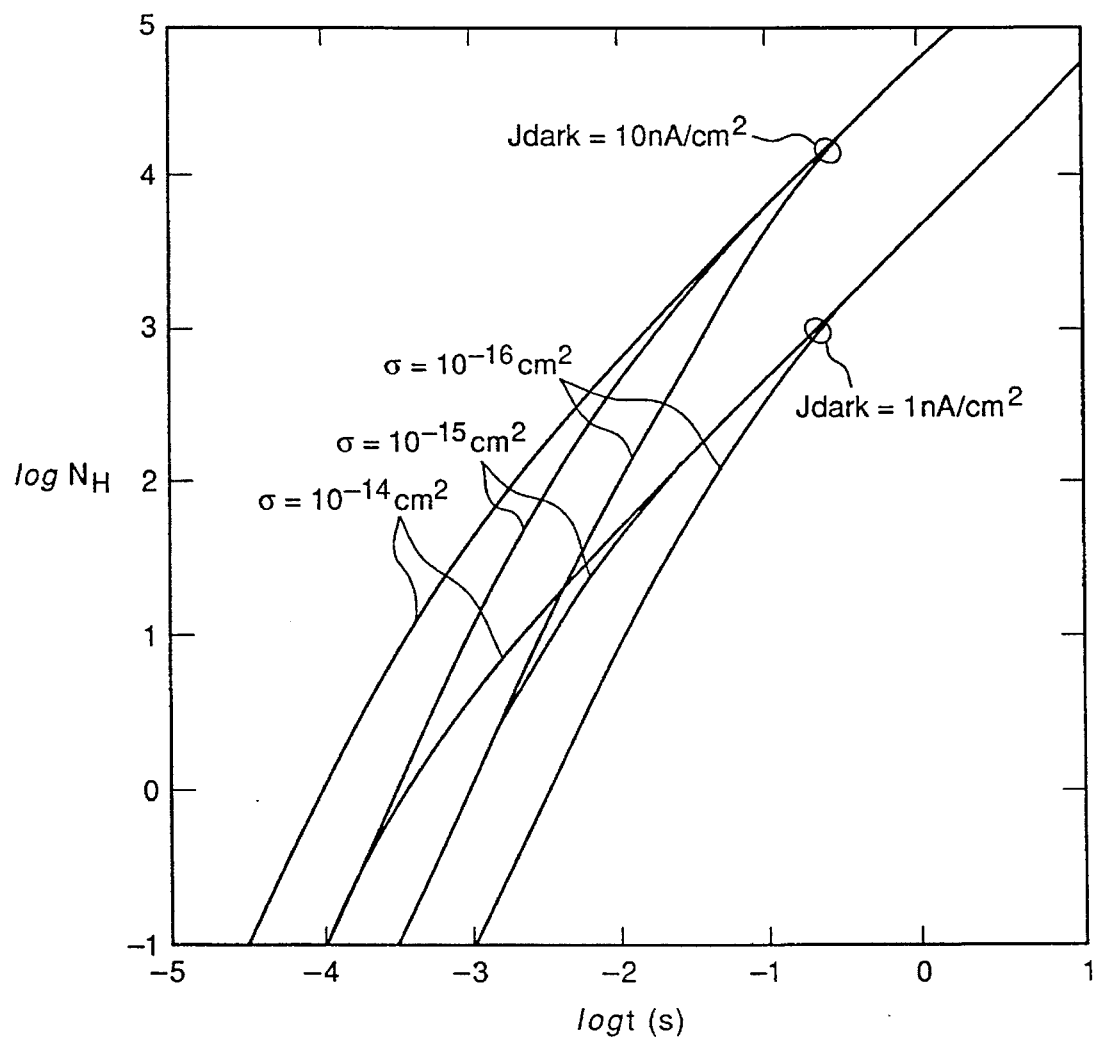
FIG. 6 is a graph for explaining the relation between the number of holes ($logN_H$) stored by the dark current generated at the boundary surface between the insulator layer and the semiconductor layer and time (logt).

FIG. 6 shows the relation between the number of holes $N_H$ generated by the dark current and the time t with $\sigma$ and $J_{dark}$ as parameters in the case where the picture size is 10 μm×10 μm. It will be seen from the Figure that it is only necessary to effect the electron filling operation at a period of about two times the horizontal scanning period H=63.5 μsec.

Next, the method of driving the solid-state image sensor comprising the picture elements of the type shown in FIGS. 1 and 2 will be explained.

Figure 3:
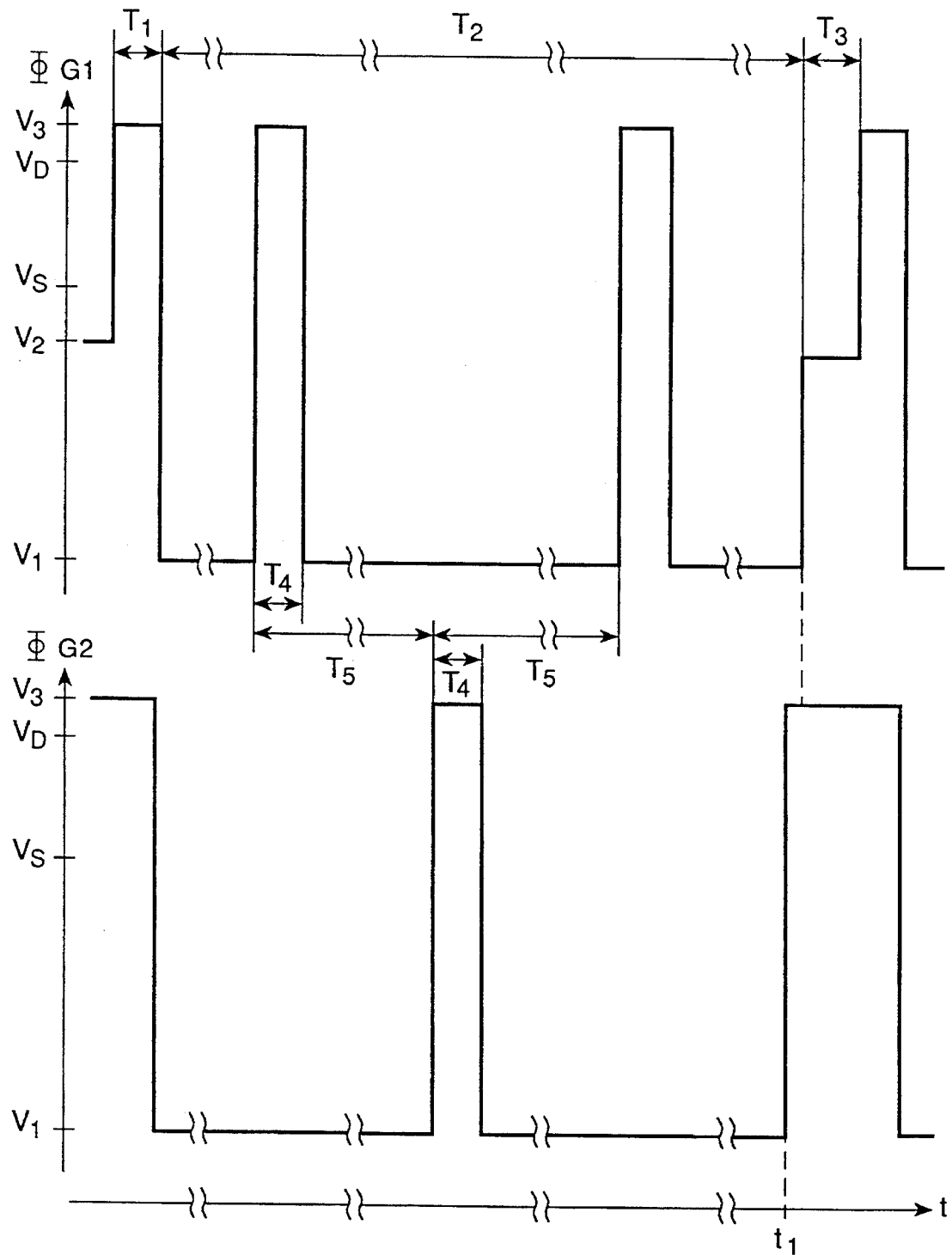
FIG. 3 is a gate driving timing chart for the solid-state image sensor according to the first embodiment ot the present invention.

FIG. 3 is a timing chart of the driving pulses supplied to the split gate electrodes (the main gate electrode and the sub gate electrode) during the driving period. In FIG. 3, the ordinate represents the voltage levels of a main gate voltage $\phi_{G1}$ supplied to the main gate electrode and a sub gate voltage $\phi_{G2}$ supplied to the sub gate electrode, and the abscissa represents the time t. Also, symbol $T_1$ represents a resetting time, $T_2$ a photogenerated charge storage time, $T_3$ a signal reading time, $T_4$ an electron filling time, and $T_5$ a ½ period of the electron filling operation.

Then, after the resetting has been effected at a voltage $V_3$, the main gate electrode 106 and the sub gate electrode 107 are each set to a voltage $V_1$ which is a reverse bias with respect to a source voltage $V_S$ and a drain voltage $V_D$ and thus this picture element is conditioned to store the photogenerated charge. In other words, the charge carriers are depleted in the surface of the semiconductor layer 102 below the gate electrodes 106 and 107 and the holes generated within the depletion layer are stored in the surface of the semiconductor layer 102. Since the present embodiment includes the divided two gate electrodes 106 and 107, the previously mentioned electron filling operation is effected by alternately applying the voltage $V_3$ to the main gate electrode 106 and the sub gate electrode 107. In this case, a surface channel communicating with the source region 103 and a surface channel communicating with the drain region 105 are respectively formed at different times in the surface of the semiconductor layer 102 below the main gate electrode 106 and in the surface of the semiconductor layer 102 below the sub gate electrode 107, and in these surface channels the empty boundary surface levels close to the energy band gap center are respectively filled with electrons at different times. In this way, by virtue of the fact that the annular main gate electrode 106 and sub gate electrode 107, which are formed on the surface of the semiconductor layer 102 in the annular region between the source region 103 and the drain region 105, are concentrically divided from each other, the present embodiment is advantageous in that during the electron filling operation no communicating channel is formed between the source and the drain and thus the current consumption is not increased.

Further, since the period of the electron filling operation is sufficient if it is about two times the horizontal scanning period H, by setting $T_5 = H$ to synchronize the electron filling operation of the nonselected picture elements with the resetting of the selected picture elements and also setting $T_1 = T_4$ to make the same the electron filling time and the resetting time of the main gate electrode 106 and the sub gate electrode 107, the sequence of driving timing is simplified and thus the construction of the driving circuit can also be simplified.

The reading of a signal is effected by applying a voltage $V_2$ to the main gate electrode 106 to obtain nondestructively a current amplified in accordance with the amount of holes generated by the lihgt. At a time $t_1$ just prior to the reading the applied voltage to the sub gate electrode 107 is changed to $V_3$ to collect the photogenerated holes below the main gate electrode 106 and in this way the gate capacity is reduced, thus ensuring a high degree of sensitivity. During the signal reading period the semiconductor layer surface portion below the sub gate electrode 107 becomes an effective drain region.

The resetting operation is effected, concurrently with the electron filling operation, by applying the voltage $V_3$ to the main gate electrode 106 and the sub gate electrode 107 so as to emit the photogenerated holes stored below the main gate electrode 106 to the semiconductor substrate 101 side.

As described hereinabove, in contrast to the solid-state image sensor comprising the MIS-type static induction transistors according to the conventional technique, the first embodiment utilizes the divided gate electrodes so as to alternately insert the operation of filling the boundary surface level with the electrons at intervals of the horizontal scanning period during the driving timing and such insertion of the electron filling operations by the split gate electrodes alone has the effect of restraining the occurrence of a dark current at the boundary surface between the insulator layer and the semiconductor layer which is the defficiency in the prior art. Further, with the solid-state image sensor comprising the MIS-type static induction transistors according to the first embodiment, the gate capacity during the signal reading period can be reduced thereby making it possible to effect the imaging with a high S/N ratio in cases where the amount of light received is weak.

Second Embodiment

With the solid-state image sensor according to the first embodiment, there is the possibility of causing a phenomenon in which during the storage period of the photogenerated charge a part of the photogenerated holes are captured in the boundary surface level filled with the electrons and they vanish by recombining with the electrons in the conduction band during the next electron filling operation. Thus, there are causes where the improvement in the sensor's sensitivity to light is limited.

In accordance with the second embodiment which will be described hereunder, it is possible to ensure an advantage that such limitation can be eliminated so that while maintaining the inherent characteristics of the amplification-type solid-state image sensor that a high aperture ratio is ensured, that a high-speed resetting is ensured, that there is no danger of the occurrence of resetting noise and persistence and that the nondestructive reading is possible, the occurrence of dark current at the boundary surface between the insulator layer and the semiconductor layer is reduced satisfactorily and the sensitivity to light is enhanced extremely.

Figure 7:
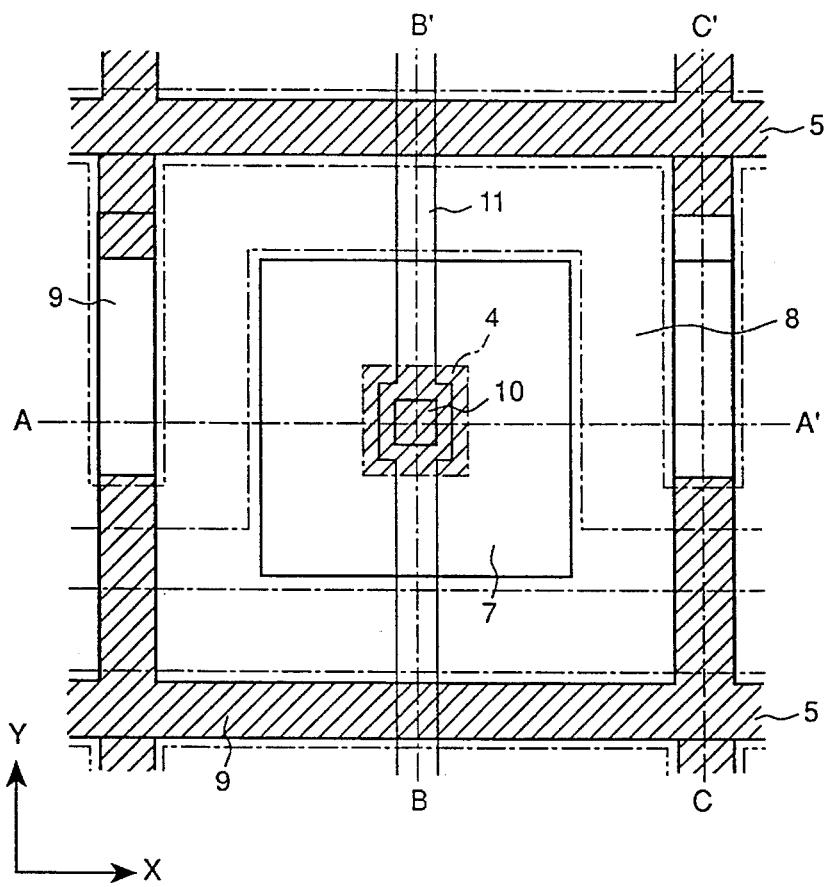
FIG. 7 is a schematic plan view of each unit picture element of a solid-state image sensor according to a second embodiment of the present invention.
Figure 8:
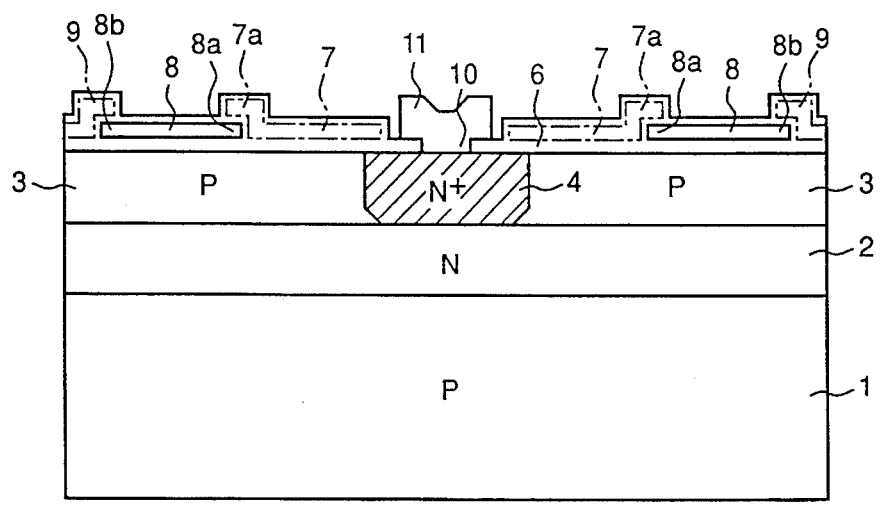
FIG. 8 shows schematically the sectional construction along the line A–A' of FIG. 7.
Figure 9:
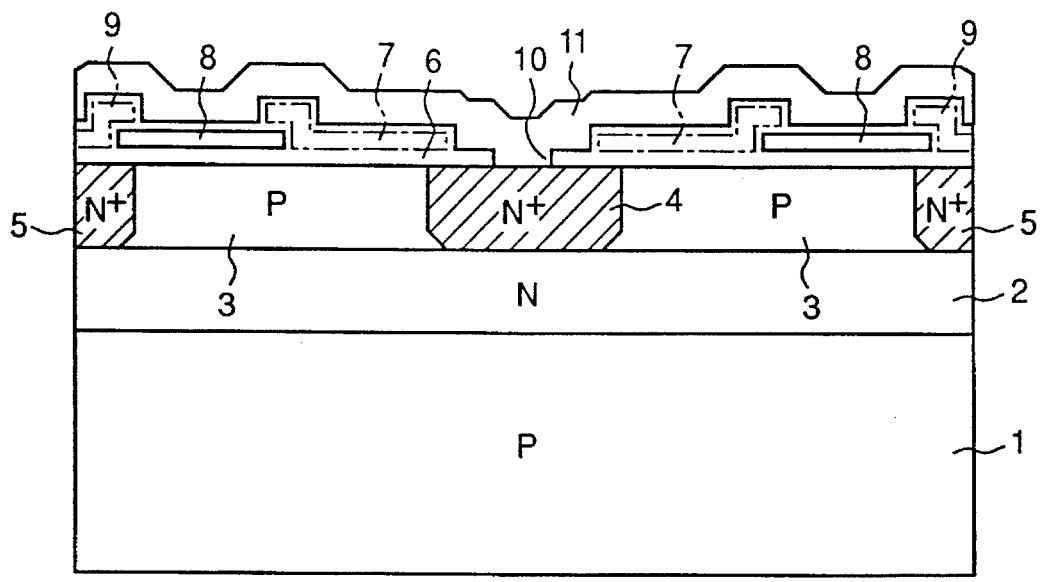
FIG. 9 shows schematically the sectional construction along the line B–B' of FIG. 7.
Figure 10:
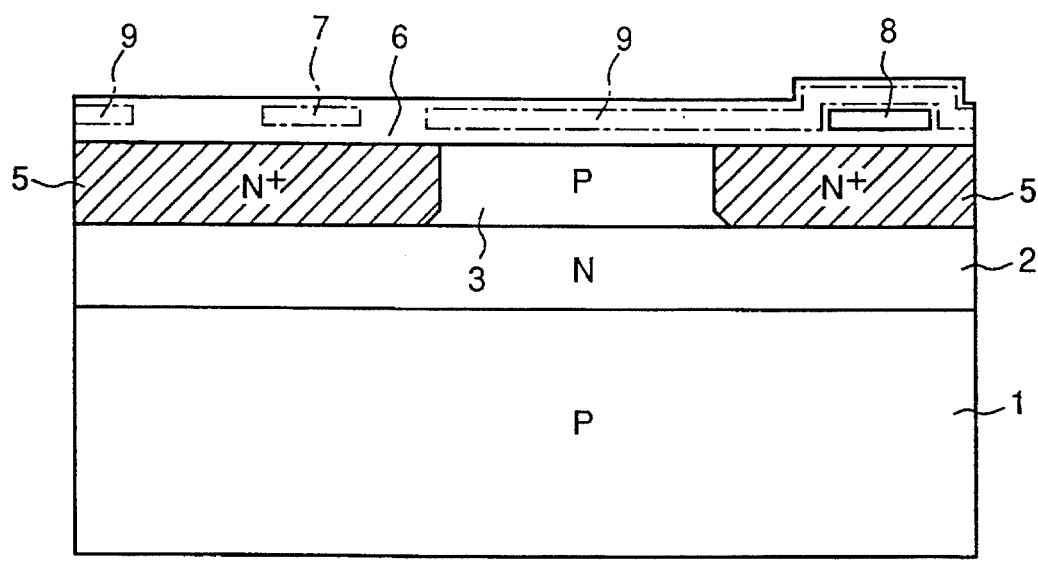
FIG. 10 shows schematically the sectional construction along the line C–C' of FIG. 7.

FIG. 7 is a plan view showing schematically one of the unit picture elements of the solid-state image sensor according to the second embodiment of the present invention, and the sectional constructions along the lines A–A', B–B' and C–C' of FIG. 7 are shown schematically in FIGS. 8, 9 and 10, respectively.

In these Figures, formed so as to lie one upon another on a P-type semiconductor substrate 1 constituting a back gate region are an N-type semiconductor layer 2 forming a channel region and a P-type semiconductor layer 3 forming a surface gate region, and an $N^+$-type source region 4 and an $N^+$-type drain region 5 are formed in the surface of the multilayer so as to be respectively connected to the N-type semiconductor layer 2. The $N^+$-type source region 4 is connected to a source line (electrode) 11 through a contact hole 10 formed in an insulator layer 6 covering the surface. Also, the $N^+$-type drain region 5 is formed between the picture elements so as to surround the associated picture element excluding a certain region of the P-type semiconductor layer 3 as shown in FIG. 7. In other words, the P-type semiconductor layer 3 of the respective picture elements is continuously formed in the X direction shown in FIG. 7.

Annular split gate electrodes 7 and 8 made of a material transparent to the wavelength range of the light used for imaging are formed on the insulator layer 6 on the surface of the P-type semiconductor layer 3 so as to surround the $N^+$-type source region 4. In other words, the split gate electrode 7 adjoining the source region 4 through its inner peripheral edge is a main gate electrode and the split gate electrode 8 adjoining the drain region 5 through its outer peripheral edge is a sub gate electrode. The outer peripheral edge 7a of the main gate electrode 7 is placed on the inner peripheral edge 8a of the sub gate electrode 8 through the insulator layer 6. While, in the present embodiment, the outer peripheral edge 7a of the main gate electrode 7 is positioned upon the inner peripheral edge 8a of the sub gate electrode 8, this vertical positional relation may be reversed. The main gate electrodes 7 and the sub gate electrodes 8 are formed in common to the respective picture elements in the X direction. A picture element isolation electrode 9 is formed in the surface portion of the P-type semiconductor layer 3 between the picture elements so as to lie on the outer peripheral edge 8b of the sub gate electrode 8, and the electrodes 9 are also formed in common to the respective picture elements in the X direction.

Figure 11:
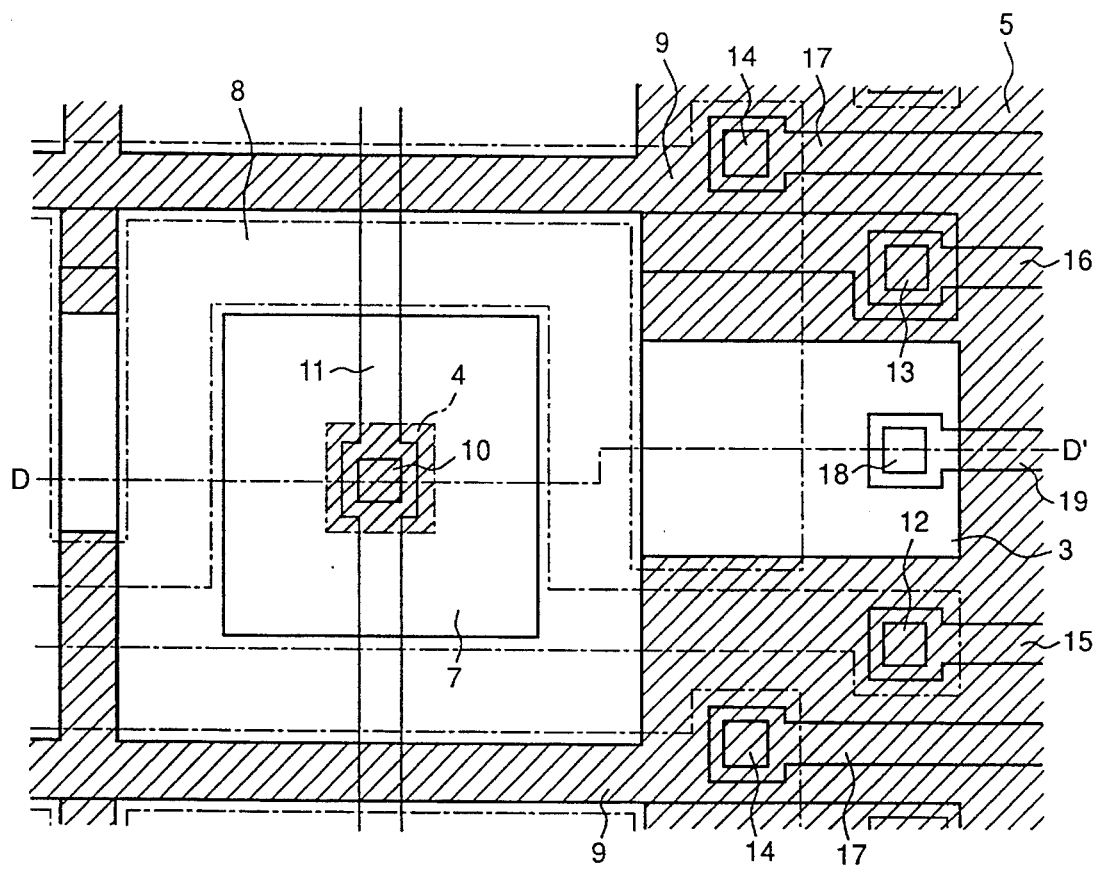
FIG. 11 is a schematic plan view of the photosensitive portion at the X-direction end of the solid-state image sensor according to the second embodiment of the present invention.
Figure 12:
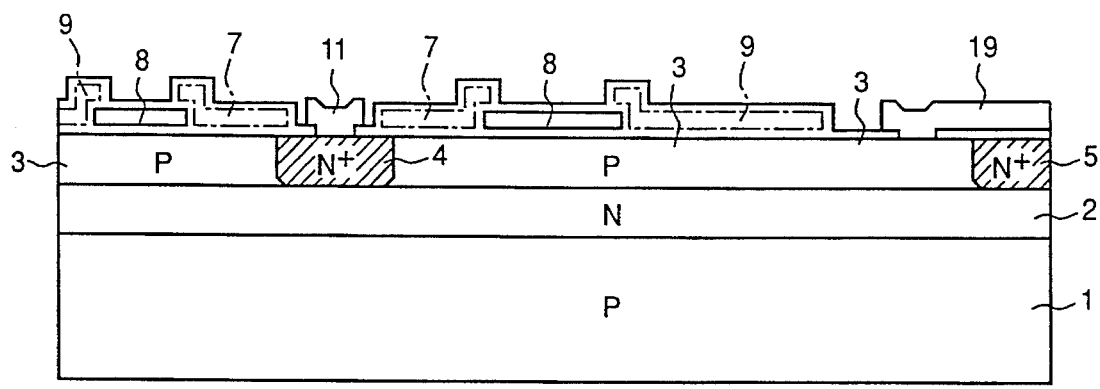
FIG. 12 shows schematically the sectional construction along the line D–D' of FIG. 11.

FIG. 11 is a plan view of the photosensitive portion and vicinity located at the X-direction end of the solid-state image sensor according to the second embodiment and the sectional construction along the line D–D' of the Figure is shown schematically in FIG. 12. The main gate electrode 7, the sub gate electrode 8 and the picture element isolation electrode 9 are respectively connected to a main gate line 15, a sub gate line 16 and a picture element isolation line 17 via through-holes 12, 13 and 14, respectively. The $N^+$-type drain region 5 is formed at the outermost periphery of the sensor photosentive region in common to the respective picture elements. The P-type semiconductor layer 3 is connected to an electrode 19 through a contact hole 18 which is formed in the insulator layer 6 at the X-direction end, and applied to the electrode 19 is a voltage which becomes a reverse bias for the N-type semiconductor layer 2, the $N^+$-type source region 4 and the $N^+$ drain region 5. Also, in the like manner as the isolation structure between the picture elements with respect to the X direction, the end-portion picture element isolation electrode 9 is disposed between the contact portion of the P-type semiconductor layer 3 with the electrode 19 and the adjoining picture element. Applied to each picture element isolation electrode 9 through the picture element isolation line 17 is a voltage of a potential selected to electrically isolate the portions of the P-type semiconductor layer 3 which serve as the surface gate regions between the picture elements. Also, the P-type semiconductor substrate 1 is reverse biased with respect to the N-type semiconductor layer 2. It is to be noted that the illustration of the electrode for providing the potential for the P-type semiconductor substrate 1 and the drain electrode is omitted.

Firstly, a description will now be made of the generation mechanism of a dark current at the boundary surface between the insulator layer and the semiconductor layer in the surface gate region of each MIS-type static induction transistor of the lateral structure according to the second embodiment and the method of restraining it.

Figure 13:
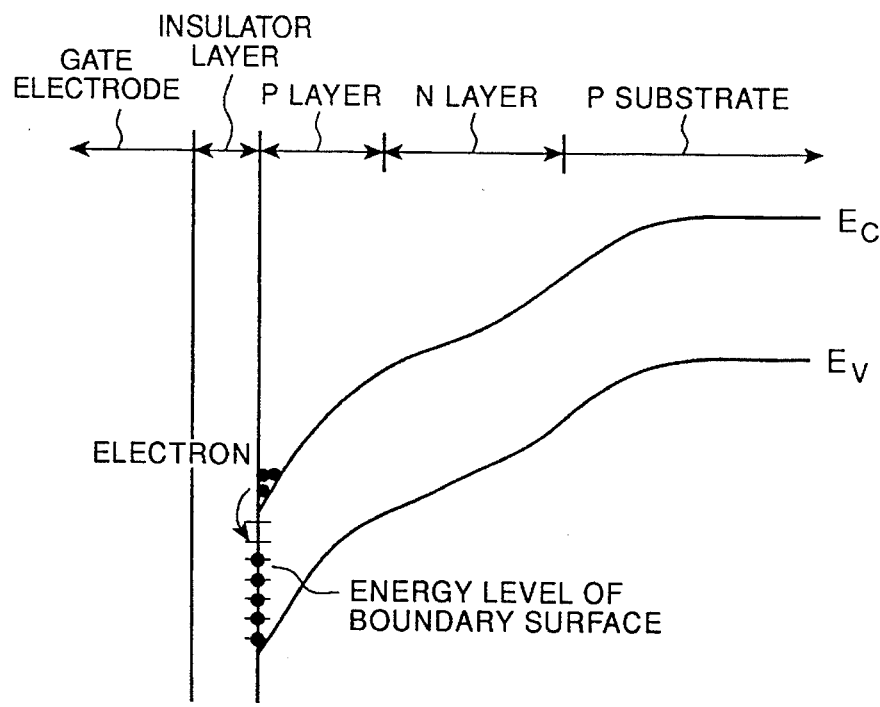
FIG. 13 is an inversion-state energy-band diagram for explaining the generation mechanism of a dark current at the boundary surface between the insulator layer and the semiconductor layer.

Assume now the case of the nonsplit gate electrode as in the conventional transistor shown in FIG. 21. When a positive voltage is applied to the gate electrode so that the transistor is reset, in response to the resetting operation the holes stored in the P-type semiconductor layer are discharged to the substrate 1 side and at the same time the surface is changed to an inversion state by the formation of a channel by the electrodes. This situation is shown as a below gate electrode energy-band diagram in FIG. 13. In the Figure, symbol $E_C$ represents the energy level of the conduction band end and $E_V$ the energy level of the valence band end.

Figure 14:
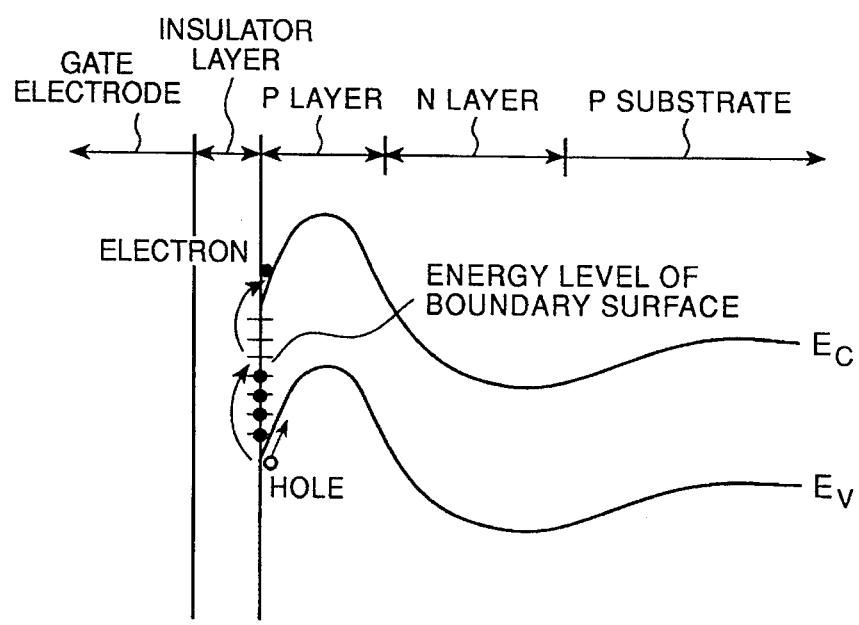
FIG. 14 is a depletion-state energy-band diagram useful for explaining the generation mechanism of a dark current at the boundary surface between the insulator layer and the semiconductor layer.

Then, when a negative voltage is applied to the gate electrode so that the photogenerated charge is stored, the depletion of the charge carriers occurs in the P-type semiconductor layer below the gate electrode and the electrons captured in the boundary surface levels tend to the thermally emitted to the conduction band starting from the boundary surface level close to the conduction band. When the emission of the electrons proceeds to the boundary surface level close to the energy band gap center, the excitation of the electrons from the valence band to that boundary surface level is started. This process can be considered as a phenomenon of the emission of the holes from the empty boundary surface levels to the valence band. The electrons captured in the boundary surface level close to the energy band gap center are further emitted to the conduction band and electron-hole pairs are generated through the boundary surface level. The electrons are removed from the surface by the electric field and the holes are stored in the P-type semiconductor layer below the gate electrode, thereby generating a dark current. This situation is shown in FIG. 14.

Then, similarly as mentioned in connection with the first embodiment, by always filling the boundary surface level close to the energy band gap center with electrons, it is possible to restrain the excitation of the electrons from the valance band and no electron-hole pairs are generated. As a result, in order to reduce the dark current generated at the boundary surface, it is only necessary that the transition from the depletion condition to the inversion condition is effected periodically through the control of the gate voltage so that the electrons are induced into the semiconductor layer surface from the $N^+$-type source region or drain region and the empty boundary surface level close to the energy band gap center is filled with the thus induced electrons.

Where such electron filling is effected on the MIS-type static induction transistor storing the photogenerated charge, in order to prevent resetting of the stored photogenerated holes, it is only necessary that the gate electrode is divided into two parts as shown in FIGS. 7 to 9, that the photogenerated holes are collected in the P-type semiconductor layer 3 below one of the split gate electrodes and the electron filling operation is performed on the other of the split gate electrodes and that this operation is alternately repeated periodically. By forming the split gate electrodes to overlap each other through the insulator layer, it is possible to effect the electron filling operation on the semiconductor layer in the whole region below the split gate electrodes. Also, the photogenerated holes can be collected without any loss below one of the split gate electrodes by the perfect transfer operation.

The period of the electron filling operation can be estimated as follows in the like manner as the first embodiment.

The occupancy function $f(E_T, t)$ of the boundary surface level of the energy level $E_T$ at a time t is as defined by the previously mentioned equation (1).

When changing from the inversion condition to the depletion condition, in the like manner as the first embodiment, the previously mentioned equation (2) is obtained by solving equation (1) under the conditions of $f(E_T, 0)=1$, $n(t)=0$ and $p(t)=0$.

On the other hand, the time constant $t_c$ for the electron capturing process in the invention condition is given as $t_c = (c_N n)^{-1}$ so that setting $\sigma_N \approx 1*10^{-15}$ cm$^2$, $v_{TH} \approx 1*10^7$ cm/sec and $n \approx 10^{18}$ cm$^{-3}$ results in $t_c \approx 0.1$ nsec and thus it will be seen that the initial condition can be appropriately set as $f(E_T, 0)=1$.

If only the hole emission process is considered, the hole generation speed $dQ_H/dt$ is given by the previously mentioned equation (3).

In the like manner as the first embodiment, the integral of equation (3) can be approximated as indicated by equation (4) and therefore the hole generation speed $dQ_H/dt$ can be given by equation (5).

From the foregoing it follows that as in the case of the first embodiment, the hole density $Q_H$ at the time t due to the dark current generated at the boundary surface is given by the previously mentioned equation (6).

Therefore, $Q_H \approx (J_{dark}/q)(t^2/2\tau)$ results when $t<<\tau$ and also $Q_H \approx (J_{dark}/q)t$ results when $t>>\tau$.

Where the picture size is 10 μm×10 μm, the relation between the number of holes $N_H$ generated by the dark current and the time t is as shown in FIG. 6 using σ and $J_{dark}$ as parameters as in the case of the first embodiment. From FIG. 6 it will be seen that it is only necessary to effect the electron filling operation at a period which is about 2 times the horizontal scanning period H=63.5 μsec.

Next, the method of driving the solid-state image sensor of the second embodiment which is comprised of the picture elements of the type shown in FIGS. 7 to 12 will be described.

In this case, the explanation will be made by utilizing again the timing chart of FIG. 3 used for the explanation of the driving method of the first embodiment. Therefore, in this case, the main gate voltage $\phi_{G1}$ of FIG. 3 is a voltage supplied to the main gate electrode 7 and similarly the sub gate voltage $\phi_{G2}$ is a voltage supplied to the sub gate electrode 8. The abscissa represents the time t, and the resetting time $T_1$, the photogenerated charge storing time $T_2$, the signal reading time $T_3$, the electron filling time $T_4$ and the ½ period $T_5$ of the electron filling operation, etc., are the same as in the case of the first embodiment.

Then, after the resetting has been effected by the voltage $V_3$, the main gate electrode 7 and the sub gate electrode 8 are set to the voltage $V_1$ which is a reverse bias with respect to the source voltage $V_S$ and the drain voltage $V_D$ so that this picture element now comes into a photogenerated charge storing condition. In other words, the charge carriers are depleted in the P-type semiconductor layer 3 and the N-type semiconductor layer 2 which are below the gate electrodes 7 and 8 and the lateral-type transistor is turned off. The holes generated within the depletion layer on the surface side than substantially the central portion of the N-type semiconductor layer 2 are stored in the lower potential inner part of the P-type semiconuctor layer 3 which has been completely depleted by a reverse bias voltage applied to the isolation electrode 19 and the reverse bias voltage $V_1$ applied to the main gate electrode 7 and the sub gate electrode 8. Therefore, the photogenerated holes will not be captured in the boundary surface level filled with the electrons and hence there is no danger of the holes vanishing due to the recombination of the captured holes and the electrons in the conduction band during the next electron filling operation.

It is to be noted that since the holes generated within the depletion layer on the substrate 1 side than substantially the central portion of the N-type semiconductor layer 2 flow out toward the substrate 1 side, it is quite ideal to deeply form the N-type semiconductor layer 2 in order to increase the quantum efficiency for the longer wavelengths.

Since the present embodiment includes the split gate electrodes 7 and 8, the above-mentioned electron filling operation is effected by alternately applying the voltage $V_3$ to the main gate electrode 7 and the sub gate electrode 8 so that in this case a surface channel communicating with the source region 4 is formed in the surface of the P-type semiconductor layer 3 below the main gate electrode 7 and a surface channel communicating with the drain region 5 is formed in the surface of the P-type semiconductor layer 3 below the sub gate electrode 8, respectively, at times different from each other; therefore, in these surface channels the empty boundary surface levels close to the center of the energy band gap are filled with the electrons at different times. In this way, the present embodiment is advantageous in that since the annular main gate electrode 7 and sub gate electrode 8 formed in the surface of the semiconductor layer 3 in the annular region between the source region 4 and the drain region 5 are concentrically separated from each other, during the electron filling operation no communicating channel is formed between the source and the drain and thus the power consumption is not increased.

Further, since the period of the electron filling operation may be suffice if it is about two times the horizontal scanning period H, by setting $T_5=H$ so as to synchronize the electron filling operation of the nonselected picture elements with the resetting of the selected picture elements and by setting so as to make the same the electron filling time and the resetting time of the main gate electrode 7 and the sub gate electrode 8, it is possible to simplify the sequence of the driving timing and thereby to simplify the construction of the driving circuit.

The signal reading is effected by applying the voltage $V_2$ to the main gate electrode 7 so as to form a channel in the N-type semiconductor layer 2 and obtaining a current amplified in accordance with the amount of the photogenerated holes in a nondestructive manner. At a time $t_1$ immediately before the reading, the voltage of the sub gate electrode 8 is changed to $V_3$ so that the photogenerated holes are collected below the main gate electrode 7 and thus the gate capacity is reduced, thereby ensuring a high degree of sensitivity. During the signal reading period, the semiconductor layer surface portion below the sub gate electrode 8 becomes an effective drain region.

The resetting operation is performed, concurrently with the electron filling operation, by applying the voltage $V_3$ to the main gate electrode 7 and the sub gate electrode 8 so as to emit the photogenerated holes stored below the main gate electrode 7 toward the P-type semiconductor substrate 1 side.

From the foregoing it will be seen that in accordance with the second embodiment the respective split gate electrodes are alternately driven by the same driving timing as the solid-state image sensor comprising the MIS-type static induction transistors according to the first embodiment so that not only the generation of the dark current at the boundary surface between the insulator layer and the semiconductor layer can be restrained but also the photosensitivity of the image sensor can be further enhanced. Further, even with the solid-state image sensor comprising the lateral-type transistors according to the second embodiment, the gate capacity during the signal reading period can be reduced and therefore the imaging with a high S/N ratio is possible even in the case where the amount of light received is very small.

Third embodiment

Figure 15:
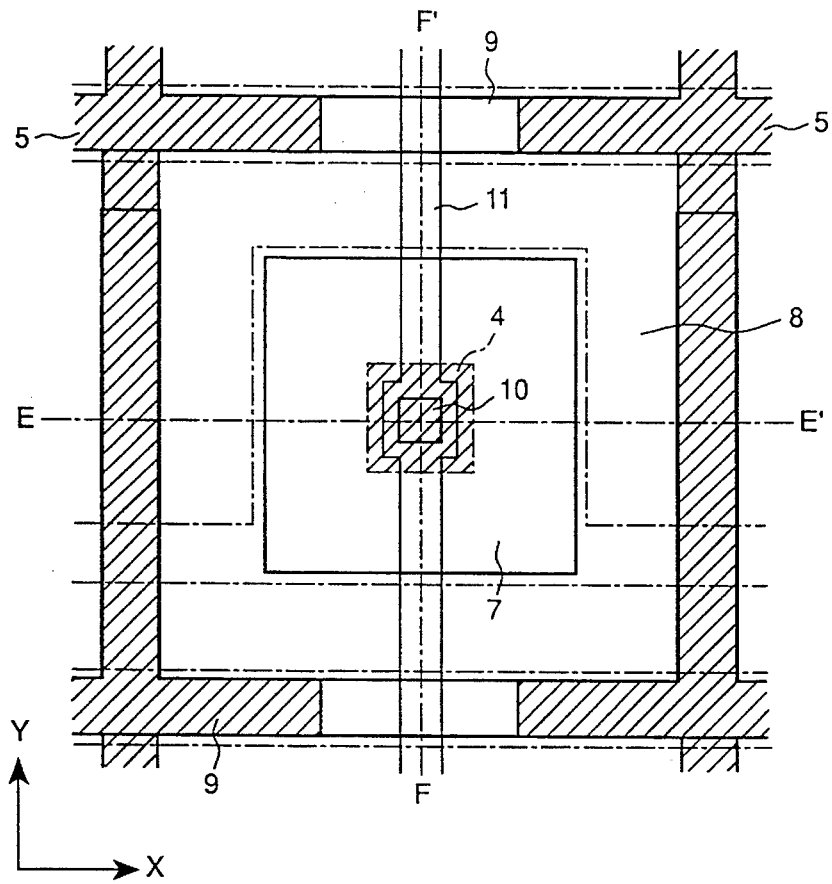
FIG. 15 is a schematic plan view of each unit picture element of a solid-state image sensor according to a third embodiment of the present invention.
Figure 16:
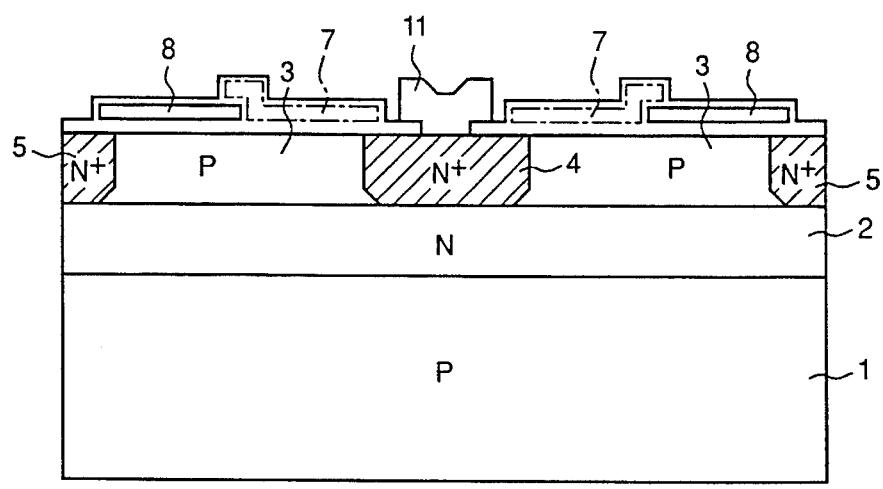
FIG. 16 shows schematically the sectional construction along the line E–E' of FIG. 15.
Figure 17:
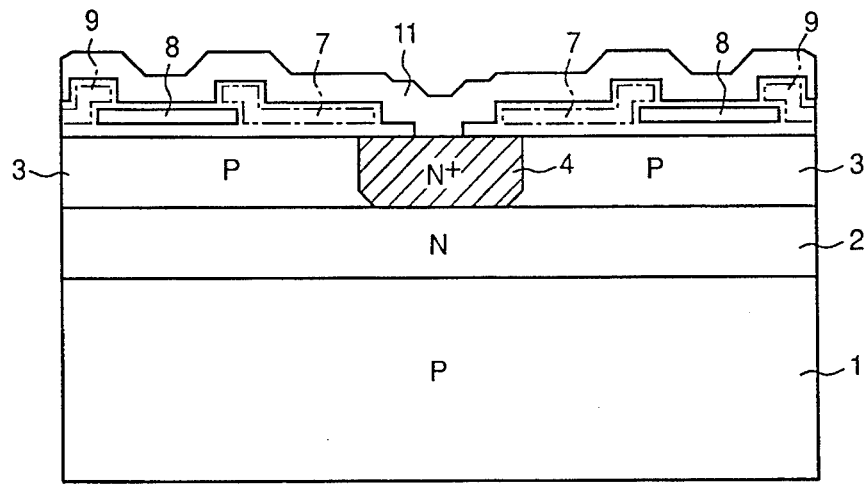
FIG. 17 shows schematically the sectional construction along the line F–F' of FIG. 15.

While, in the above-described second embodiment, the P-type semiconductor layer 3 is continuously formed in the respective picture elements in the X direction, the P-type semiconductor layer 3 can be continuously formed in the respective picture elements in the Y direction. FIG. 15 is a schematic plan view for each of the unit picture elements of a solid-state image sensor according to a third embodiment of the present invention, and the sectional constructions along the line E–E' and the line F–F' of FIG. 15 are schematically shown in FIGS. 16 and 17, respectively. In these Figures, the same reference numerals as in the second embodiment indicate the corresponding counterparts. While, in the third embodiment, the P-type semiconductor layer 3 in the respective picture elements is continuous in the Y direction and not in the X direction, it is needless to say that there is no great difference between it and the second embodiment and it ensures the same functions and advantages.

Fourth Embodiment

Figure 18:
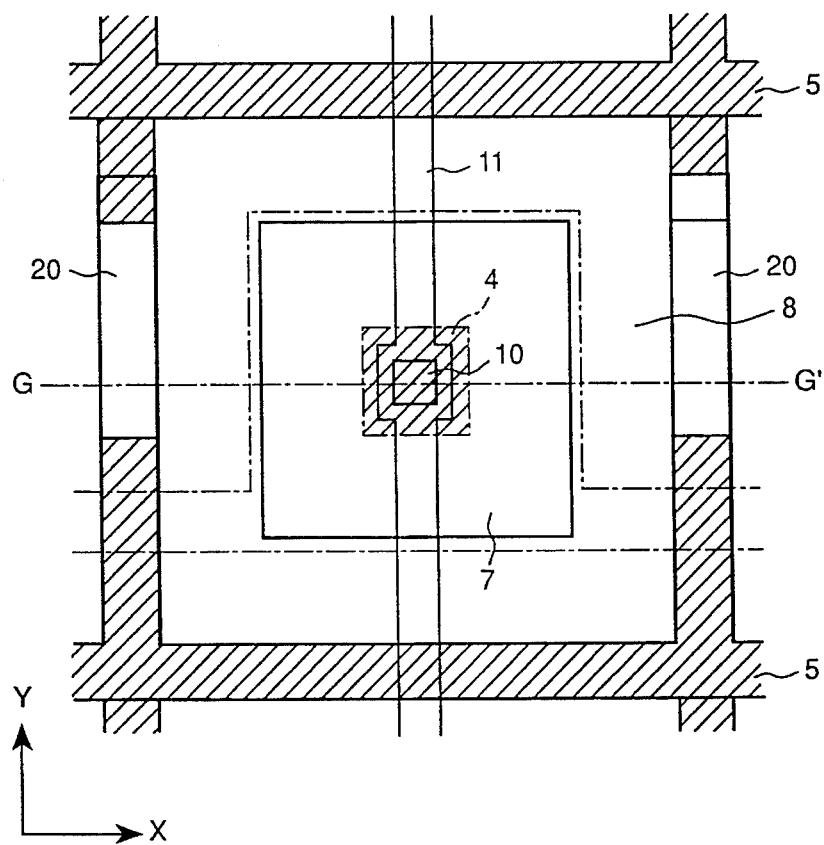
FIG. 18 is a schematic plan view of each unit picture element of a solid-state image sensor according to a fourth embodiment of the present invention.
Figure 19:
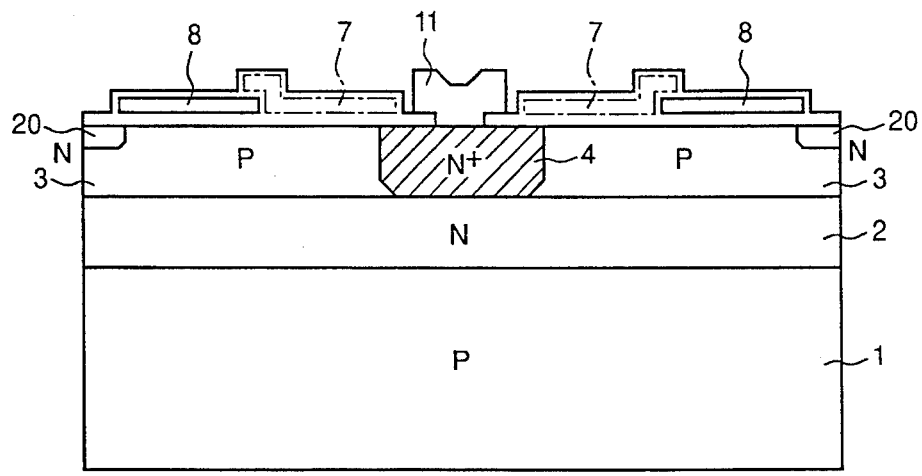
FIG. 19 shows schematically the sectional construction along the line G–G' of FIG. 18.

FIG. 18 is a schematic plan view for each of the unit picture elements of a solid-state image sensor according to a fourth embodiment of the present invention, and FIG. 19 shows schematically the sectional construction along the line G–G' of FIG. 18. The fourth embodiment differs from the second and third embodiments only with respect to the construction of the picture element isolation regions and there is no great difference between it and the second and third embodiments with respect to the overall functions as the image sensor.

While, in each of the second and third embodiments, a voltage is applied to the picture element isolation electrode 9 for the depletion of the P-type semiconductor layer 3 below the electrode 9 thereby isolating the surface gate regions of the respective picture elements from each other, in the fourth embodiment an N-type region 20 of a relatively small diffusion depth is formed in the surface of the P-type semiconductor layer 3 of each picture element isolation region so as to be connected to the drain region 5 so that the P-type semiconductor layer 3 below the shallow N-type region 20 is depleted and the isolation between the picture elemetns is provided. As a result, the fourth embodiment is advantageous in that no picture element isolation electrodes are needed and the device construction is simplified.

Fifth Embodiment

Figure 20:
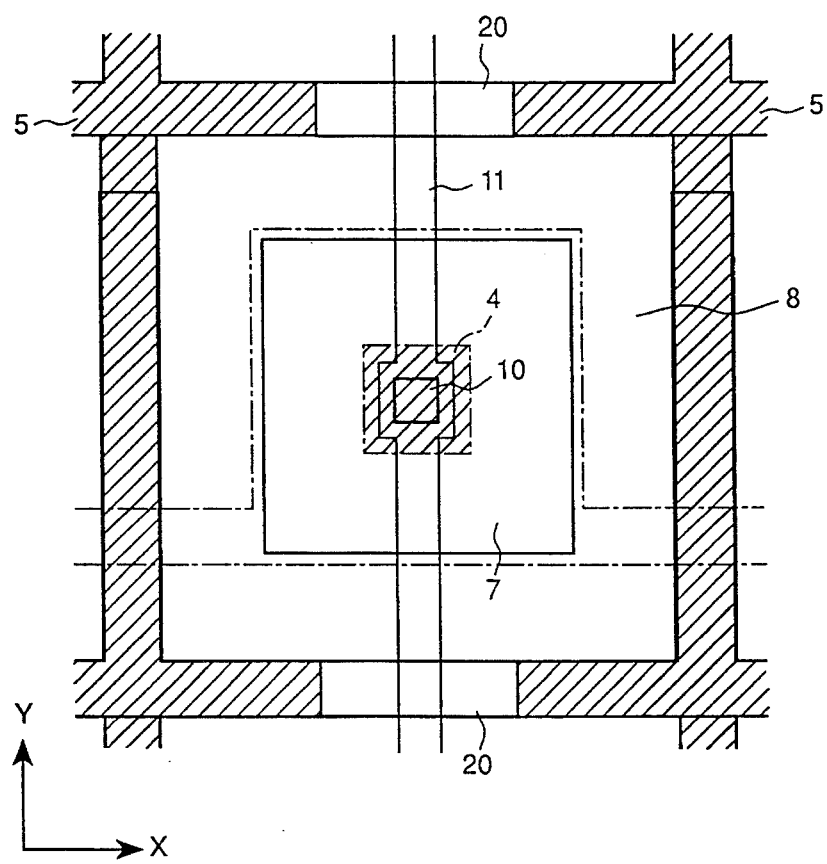
FIG. 20 is a schematic plan view of each unit picture element of a solid-state image sensor according to a fifth embodiment of the present invention.

FIG. 20 is a schematic plan view for each of the unit picture elements of a solid-state image sensor according to a fifth embodiment of the present invention, in which the P-type semiconductor layer 3 is formed continuously in the Y direction to extend beyond the drain regions 5 between the respective picture elements and the shallow N-type regions 20 are provided for the isolation of the picture elements from one another. It is needless to say that the same effect as the second and third embodiments can be obtained even with the picture element isolation regions 20 of this construction.

From the foregoing description of its embodiments it will also be seen that in accordance with the present invention there is a remarkable effect that in an amplification-type solid-state image sensor the occurrence of dark current at the boundary surface between an insulator layer and a semiconductor layer of a transistor forming each picture element of the sensor can be effectively restrained without considerably modifying the basic construction and the driving method of the transistors than previously and a higher sensitivity is ensured without losing the inherent advantages of the amplification-type solid-state image sensor.

What is claimed is:

1. A solid-state image sensor comprising a plurality of picture elements, each of said picture elements comprising:

a semiconductor substrate of a first conductivity type;

a semiconductor layer of a second conductivity type formed on said semiconductor substrate;

a source region and a drain region of said second conductivity type, each of which is formed in a surface of said semiconductor layer and having a higher impurity density than that of said semiconductor layer; and a plurality of split gate electrodes formed on the surface of said semiconductor layer between said source region and said drain region and insulated from said semiconductor layer surface, said split gate electrodes overlapping each other through an insulator layer.

2. A solid-state image sensor according to claim 1, wherein a voltage is applied to said plurality of split gate electrodes to induce carriers of the same conductivity type as said semiconductor layer of the second conductivity type in the surface of said semiconductor layer.

3. A solid-state image sensor comprising a plurality of picture elements, each of said picture elements comprising:

a semiconductor substrate of a first conductivity type;

a semiconductor layer of a second conductivity type formed on said semiconductor substrate;

a semiconductor layer of said first conductivity type formed on said semiconductor layer of the second conductivity type;

a source region and a drain region of said second conductivity type, each of which is formed in said semiconductor layer of the first conductivity type so as to be connected to said semiconductor layer of the second conductivity type and having a higher impurity density than that of said semiconductor layer of the second conductivity type; and a plurality of split gate electrodes formed on a surface of said semiconductor layer of the first conductivity type between said source region and said drain region and insulated from said surface so as to surround said source region, said split gate electrodes overlapping each other through an insulator layer.

4. A solid-state image sensor according to claim 3, wherein a voltage is applied to said plurality of split gate electrodes to induce carriers of the same conductivity type as said semiconductor layer of the second conductivity type in the surface thereof.

* * * * *